(12) United States Patent
Dishongh et al.

(10) Patent No.: US 6,884,939 B2
(45) Date of Patent: Apr. 26, 2005

(54) CONSTRUCTING OF AN ELECTRONIC ASSEMBLY HAVING A DECOUPLING CAPACITOR

(75) Inventors: Terrance J. Dishongh, Portland, OR (US); Tom E. Pearson, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/465,214

(22) Filed: Jun. 18, 2003

(65) Prior Publication Data

US 2004/0256133 A1 Dec. 23, 2004

(51) Int. Cl.[7] .................................................. H02G 3/08
(52) U.S. Cl. ..................... 174/52.1; 257/691; 257/686; 257/738; 257/777
(58) Field of Search .................................. 257/691, 735, 257/738, 778, 686, 791, 736; 174/52.1

(56) References Cited

U.S. PATENT DOCUMENTS

2003/0218235 A1 * 11/2003 Searls et al. ................ 257/532

* cited by examiner

*Primary Examiner*—Hung V. Ngo
(74) *Attorney, Agent, or Firm*—Blakely, Sokoloff, Taylor & Zafman LLP

(57) ABSTRACT

An electronic assembly is provided, having a capacitor interconnected between BGA solder balls. The capacitor is placed on a motherboard and soldered to the BGA solder balls when the BGA solder balls are soldered to electric lands on the motherboard.

13 Claims, 4 Drawing Sheets

US 6,884,939 B2

CONSTRUCTING OF AN ELECTRONIC ASSEMBLY HAVING A DECOUPLING CAPACITOR

BACKGROUND OF THE INVENTION

1). Field of the Invention

This invention relates to an electronic assembly having a decoupling capacitor and to a method according to which it is constructed.

2). Discussion of Related Art

Integrated circuits are usually manufactured in and on semiconductor wafers that are subsequently diced or singulated into individual microelectronic dies. Such a microelectronic die is usually mounted to a package substrate for purposes of providing rigidity thereto and through which signals can be provided to and from the integrated circuit. Such a package substrate often has an array of solder ball interconnection members, also referred to as a ball grid array (BGA), on an opposing surface that are placed on electric lands of a motherboard and, by a thermal reflow process, soldered thereto.

Such a motherboard usually includes a carrier substrate with a power plane and a ground plane therein. A power source is connected to the power plane, and the ground plane is connected to ground. The power and ground planes are connected to separate ones of the electric lands. In addition, input and output (IO) signal sources are connected to other ones of the electric lands. Power, ground, and IO signals can thus be provided through the motherboard, the solder ball interconnection members, and the package substrate to and from the integrated circuit in the microelectronic die.

In order to reduce inductive-capacitance delay, it is usually advantageous to include one or more decoupling capacitors having opposing terminals connected to the power and ground planes. An existing technique is to connect a capacitor between two of the solder ball interconnection members before the solder ball interconnection members are located on the electric lands of the motherboard. Such a process is expensive because it requires additional manufacturing steps, including the placement of the capacitor, and controlled heating and cooling of the solder ball interconnection members so that they reflow over capacitor terminals of the capacitor. These steps have to be carried out before the package (i.e., the combination of the package substrate, the microelectronic die, the solder ball interconnection members, and the capacitor) are shipped to an entity that does the final assembly on the motherboard.

BRIEF DESCRIPTION OF THE DRAWINGS

The invention is described by way of example with reference to the accompanying drawings, wherein.

DETAILED DESCRIPTION OF THE INVENTION

An electronic assembly is provided, having a capacitor interconnected between BGA solder balls. The capacitor is placed on a motherboard and soldered to the BGA solder balls when the BGA solder balls are soldered to electric lands on the motherboard.

Figure 1:
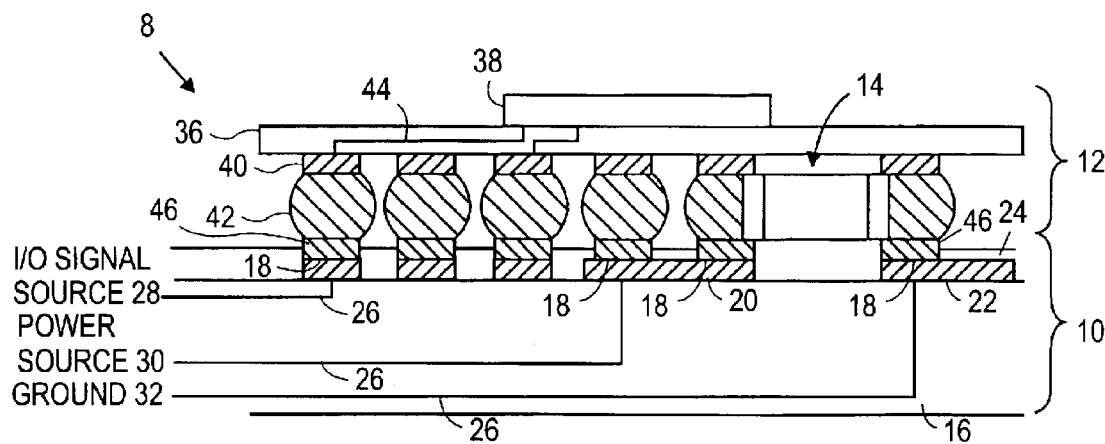
FIG. 1 is a cross-sectional side view illustrating an electronic assembly, according to an embodiment of the invention, having a decoupling capacitor between a semiconductor package and a motherboard of the assembly.

FIG. 1 of the accompanying drawings illustrates an electronic assembly 8 according to an embodiment of the invention. The electronic assembly 8 includes a motherboard 10, a semiconductor package 12, and a capacitor 14 mounted to the motherboard 10.

The motherboard 10 includes a carrier substrate 16 which is made of a nonconductive dielectric material. The motherboard 10 further has a plurality of electric lands 18 that are formed near an upper surface of the carrier substrate 16. The motherboard 10 further has power and ground planes 20 and 22 respectively. The electric lands 18 and the power and ground planes 20 and 22 are at the same elevation and are formed below an upper surface of a solder mask or upper dielectric layer 24 of the carrier substrate 16. Openings are formed in the upper dielectric layer 24 through which portions of the power and ground planes 20 and 24 are also exposed to leave additional electric lands 18 on the power and ground planes 20 and 24 exposed. Metal lines 26 are formed in the carrier substrate 16. Some of the metal lines 26 connect some of the electric lands 18 to input and output (IO) signals 28. One of the lines 26 connects the power plane 20 to a power source 30. Another one of the lines 26 connects the ground plane 22 to ground 32.

The semiconductor package 12 includes a package substrate 36, a microelectronic die 38, a plurality of contact pads 40, and a plurality of solder ball interconnection members 42.

The microelectronic die 38 is typically a semiconductor die having an integrated circuit formed therein. The microelectronic die 38 is mounted on an upper surface of the package substrate 36. A plurality of controlled collapse chip connect (C4) interconnection members 42 are formed in an array on a lower surface of the microelectronic die 38, and are used to connect the microelectronic die 38 structurally and electrically to terminals on the package substrate 36. The contact pads 40 are formed on a lower surface of the package substrate 36. Metal lines 44 in the package substrate 36 interconnect the terminals on the upper surface thereof with the contact pads 40. Each solder ball interconnection member 42 is attached to a respective one of the contact pads 40, typically before the microelectronic die 38 is mounted on the package substrate 36.

Figure 2A:
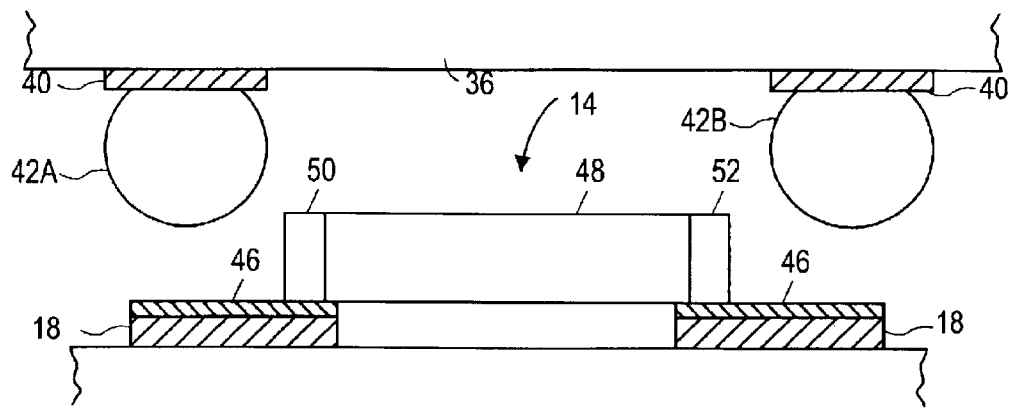
FIG. 2A is a cross-sectional side view illustrating a portion of the semiconductor package and a portion of the motherboard after the capacitor is located on the motherboard.
Figure 2B:
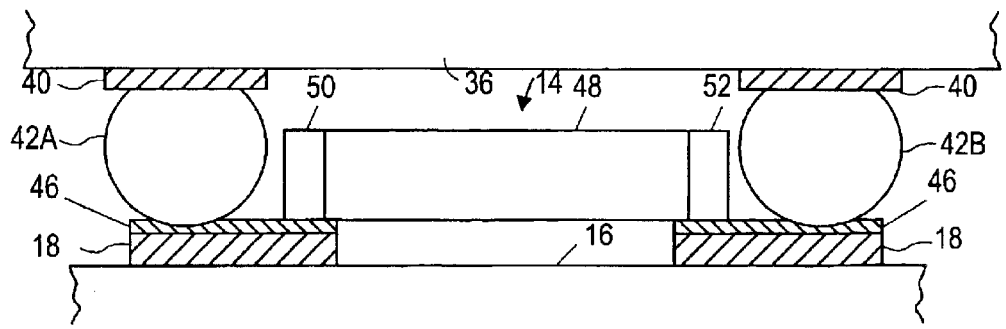
FIG. 2B is a view similar to FIG. 2A after the semiconductor package is positioned on the motherboard.
Figure 2C:
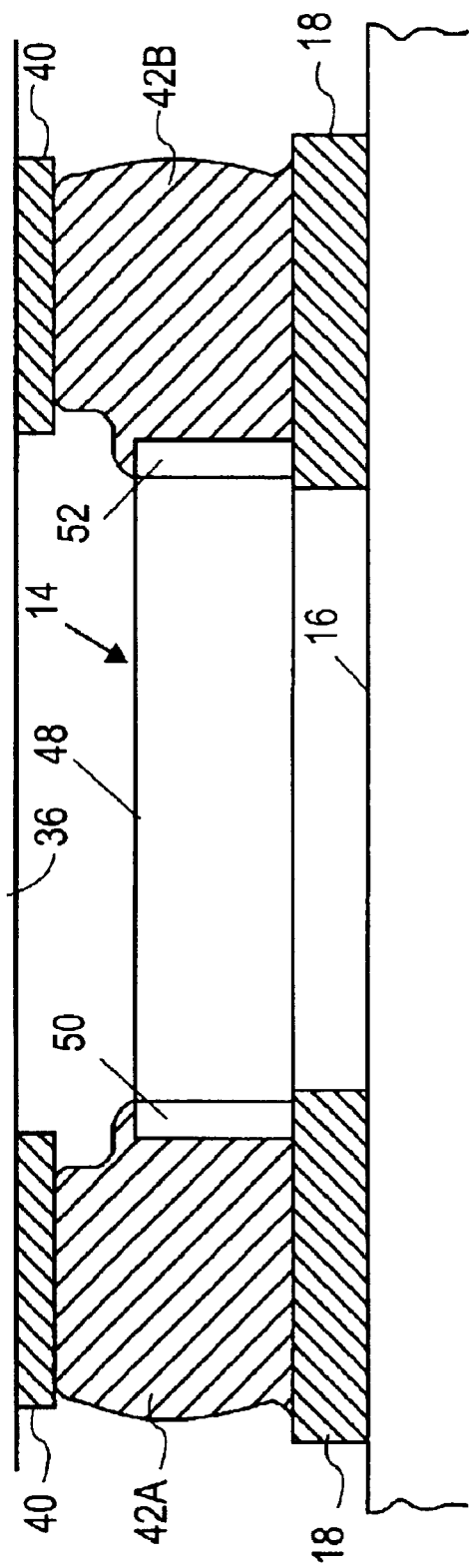
FIG. 2C is a view similar to FIG. 2B after reflow of solder ball interconnection members of the semiconductor package.

FIGS. 2A, 2B, and 2C illustrate how the solder ball interconnection members 42 are attached to the electric lands 18. FIGS. 2A, 2B, and 2C also illustrate how the capacitor 14 is connected between two of the solder ball interconnection members 42 and through the solder ball interconnection members 42 to the power and ground planes 20 and 22 shown in FIG. 1.

As illustrated in FIG. 2A, a layer of solder paste 46 is first applied to each electric land 18. The capacitor 14 has a capacitor body 48 and capacitor terminals 50 and 52 at each respective end of the capacitor body 48. The capacitor 14 is positioned above the carrier substrate 16 with each capacitor terminal 50 or 52 resting on a respective one of the electric lands 18. The layers of solder paste 46 provide a tackiness that retains the capacitor terminals 50 and 52 in position. What can be noted is that the capacitor 14 is not permanently attached to the electric lands 18 or the solder ball interconnection members 42 at this stage, and that the package substrate 36 and solder ball interconnection members 42 are still distant from the capacitor 14 and the electric lands 18.

Next, as illustrated in FIG. 2B, the package substrate 36 (with the microelectronic die 38 thereon) is lowered down to the motherboard 10 until each one of the solder ball interconnection members 42 inserts itself into a respective layer of solder paste 46. The arrangement of the solder ball interconnection members 42 thus matches the layout of the electric lands 18. The solder ball interconnection members 42 are at all stages still solid (not softened or melted), and the capacitor terminals 52 fit in between two of the solder ball interconnection members 42A and 42B. The capacitor 14 is now between the package substrate 36 and the motherboard 10, and covered by the package substrate 36.

FIG. 2C illustrates the assembly of FIG. 2B after the entire assembly is heated and subsequently allowed to cool. Heating softens, melts, and reflows the solder ball interconnection members 42, and the reflow is assisted by the layers of solder paste 46. Each solder ball interconnection member 42 reflows onto the respective electric land 18 on which it is located and, after cooling down and again solidifying, is structurally and electrically connected to the respective electric land 18. The package substrate 36 is now mounted at a spaced location above and to the motherboard 10. In addition, the solder ball interconnection members 42A and 42B reflow onto upper end and side surfaces of the capacitor terminals 50 and 52 respectively. After being cooled down, the capacitor terminal 50 is connected through the solder ball interconnection member 42A to the electric land 18 to which the solder ball interconnection member 42A is attached. Similarly, the capacitor terminal 52 is connected through the solder ball interconnection member 42B to the electric land 18 to which it is attached.

Referring again to FIG. 1, it can be seen that the capacitor 14 connects the power and ground planes 20 and 22 to one another, to reduce resistive-capacitive delay. An advantage of having the capacitor 14 between the motherboard 10 and the semiconductor package 12 is that decoupling capacitance can be provided closer to the semiconductor package 12, and to the microelectronic die 38.

The manner in which the electronic assembly 8 is assembled is that the capacitor 14 does not have to be pre-mounted to the semiconductor package 12 at great cost. A subcontractor may, accordingly, simply locate the capacitor 14 on the motherboard 10 and connect the capacitor 14 during normal BGA reflow.

Figure 3:
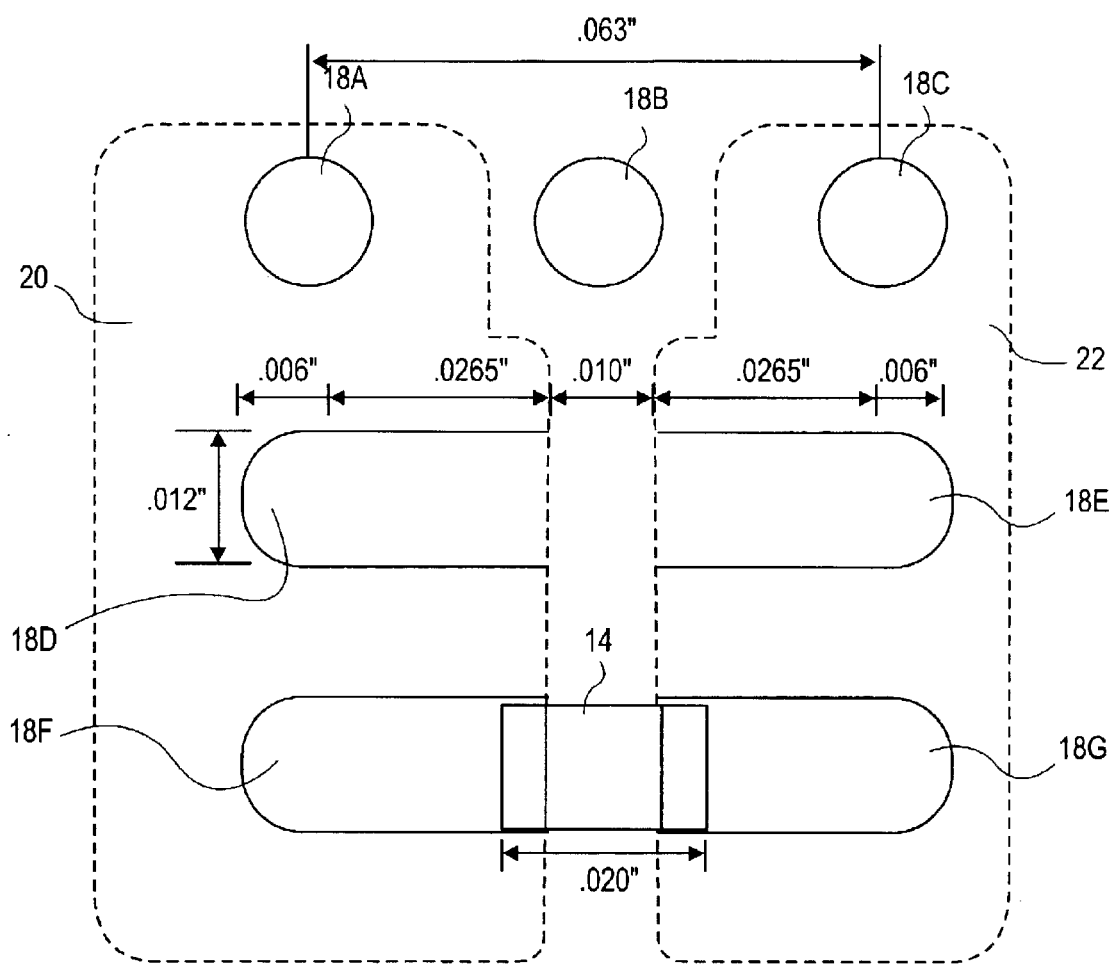
FIG. 3 is a top plan view illustrating a layout of electric lands, and power and ground planes of the motherboard.

FIG. 3 illustrates the layout of the electric lands 18 in order to accommodate the capacitor 14. Three of the electric lands 18A, 18B, and 18C are in a first row. Two more of the electric lands 18D and 18E are in a second row parallel to the first row. Two more of the electric lands 18F and 18G are in a third row parallel to the second row, with the second row between the first and third rows.

The electric land 18A is in a first column, and portions of the electric lands 18D and 18F are in the same column as the electric land 18A. Similarly, the electric land 18C is in a second column, and portions of the electric lands 18E and 18G are in the second column of the electric land 18C. The electric land 18B is in a third column between the first and second columns. There is no electric land in the second row (which includes the electric lands 18D and 18E) having a center point in the third column of the electric land 18B. Similarly, there is no electric land in the third row (of the electric lands 18F and 18G) having a center point in the second column of the electric land 18B. The second and third rows are thus "depopulated" when compared with the first row.

The electric lands 18A, 18D, and 18F are all connected to the power plane 20. The electric lands 18C, 18D, and 18G are all connected to the ground plane 22. The power and ground planes 20 and 22 have a gap between them which is larger in the first row (of the electric lands 18A, 18B, and 18C) than in the second and third rows (of the electric lands 18D, 18E, 18F, and 18G). The extra width of the spacing between the power and ground planes 20 and 22 at the first row allows for placement of the electric land 18B without being connected to either the power or ground plane 20 or 22. Depopulation of the third column of the electric land 18B at the second and third rows simultaneously allows for placement of the capacitor 14 across the third column of the electric land 18B. Although the capacitor illustrated in FIG. 3 is relatively short, a larger capacitor can be used because such a larger capacitor would be connected to electric lands 18F and 18G in columns that are relatively far apart.

Figure 4:
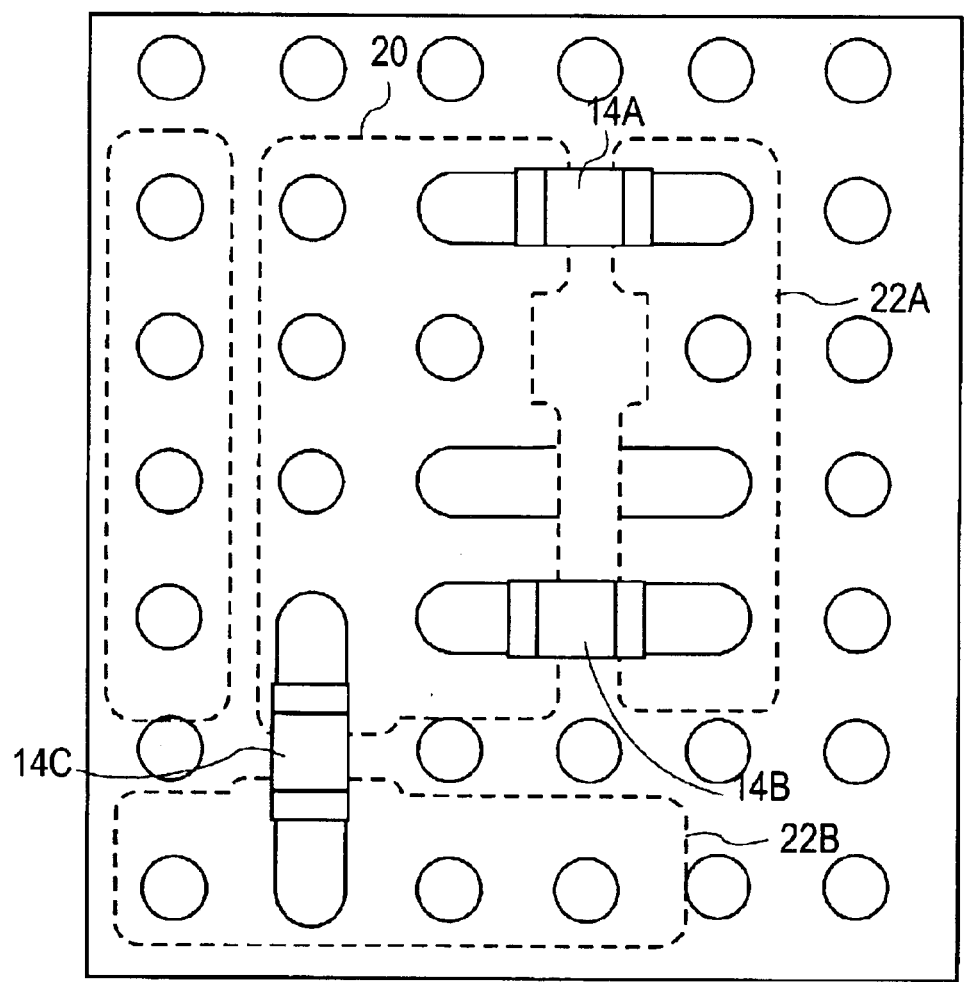
FIG. 4 is a top plan view illustrating more ground and power planes that are interconnected with additional decoupling capacitors.

As illustrated in FIG. 4, multiple power or ground planes may be provided, in the present example one power plane 20 and two ground planes 22A and 22B. The power and ground planes 20, 22A, and 22B can be interconnected with multiple capacitors 14A, 14B, and 14C. The power plane 20 can also be connected to the ground plane 22A with two capacitors 14A and 14B. The design thus allows for placement of capacitors according to the requirements for decoupling capacitors in a particular area.

The capacitor terminals 50 and 50A are each located on a respective one of the electric lands 18.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed:

1. An electronic assembly, comprising:
   a lower substrate;
   a plurality of electric lands on an upper side of the lower substrate;
   an upper substrate above and spaced from the lower substrate;
   a plurality of contact pads on a lower side of the upper substrate;
   a plurality of interconnection members, each located between and electrically connecting a respective electric land to a respective contact pad, a first and second of the interconnection members having center lines that are a first distance apart; and
   a capacitor having a capacitor body and first and second capacitor terminals, the first and second capacitor terminals respectively being in contact with a third and a fourth of the interconnection members having center lines that are a second distance apart, the second distance being more than the first distance.

2. The electronic assembly of claim 1, further comprising:
   power and ground planes held by the lower substrate, the third and fourth interconnection members being connected to the power and ground planes respectively.

3. The electronic assembly of claim 2, wherein the first and second interconnection members are connected to the power and ground planes respectively.

4. The electronic assembly of claim 3, wherein the interconnection members include a fifth interconnection member between the first and second interconnection members.

5. The electronic assembly of claim 4, wherein the first and third interconnection members are in the same column; the second and fourth interconnection members are in the same column; the first, second, and fifth interconnection members are in the same row; and the third and fourth interconnection members are in the same row.

6. The electronic assembly of claim 1, further comprising:
a microelectronic die, having an integrated circuit formed therein, mounted to the upper substrate and connected to the interconnection members.

7. An electronic assembly, comprising:
a substrate;
a ground plane held by the substrate;
a power plane held by the substrate;
first, second, and third electric lands sequentially after one another in a first row on the substrate;
fourth and fifth electric lands on the substrate, the fourth electric land being connected to the power plane and being located in a column that includes the first electric land, and the fifth electric land being connected to the ground plane and being located in a column that includes the third electric land; and
a capacitor having a capacitor body and first and second capacitor terminals connected to the fourth and fifth electric lands, respectively.

8. The electronic assembly of claim 7, wherein the capacitor terminals are at least partially connected to the electric lands through interconnection members that are attached to the electric lands.

9. The electronic assembly of claim 8, wherein the interconnection members are solder balls that are reflowed onto the capacitor terminals.

10. An electronic assembly, comprising:
a substrate;
a ground plane held by the substrate;
a power plane held by the substrate;
first, second, and third electric lands sequentially after one another in a first row on the substrate, the first and third electric lands being connected to the power and ground planes respectively;
fourth and fifth electric lands on the substrate, the fourth electric land being connected to the power plane and being located in a column that includes the first electric land, and the fifth electric land being connected to the ground plane and being located in a column that includes the third electric land, with no electric land on the substrate with a center point in a column that includes a center point of the second electric land.

11. The electronic assembly of claim 10, wherein the fourth and fifth electric lands are in a second row parallel to the first row.

12. The electronic assembly of claim 11, wherein the ground and power planes are at the same elevation in the substrate.

13. The electronic assembly of claim 12, wherein a gap between the ground and power planes is wider at the first row than at the second row.

\* \* \* \* \*